United States Patent
Maghsoudnia

(10) Patent No.: US 6,171,922 B1
(45) Date of Patent: Jan. 9, 2001

(54) SICR THIN FILM RESISTORS HAVING IMPROVED TEMPERATURE COEFFICIENTS OF RESISTANCE AND SHEET RESISTANCE

(75) Inventor: Pirouz Maghsoudnia, San Jose, CA (US)

(73) Assignee: National Semiconductor Corporation, Santa Clara, CA (US)

(*) Notice: Under 35 U.S.C. 154(b), the term of this patent shall be extended for 0 days.

(21) Appl. No.: 08/115,440

(22) Filed: Sep. 1, 1993

(51) Int. Cl.[7] .......................... C23C 14/34; H01L 21/324
(52) U.S. Cl. .......................... 438/385; 438/381; 438/382; 438/384; 438/660; 438/663; 438/669; 438/670; 438/671; 438/683; 438/688; 438/695; 204/192.21
(58) Field of Search .................. 204/192.21, 192.23, 204/192.37, 192.25, 192.15; 156/661.1, 662, 665; 437/200, 247, 248, 918, 174; 438/381, 382, 384, 385, 660, 663, 669, 670, 671, 683, 688, 795

(56) References Cited

U.S. PATENT DOCUMENTS

| H546 | 11/1988 | Schnable, et al. | 419/7 |
|---|---|---|---|
| 4,510,178 | * 4/1985 | Paulson et al. | 204/192.21 |
| 4,520,342 | * 5/1985 | Vugts | 204/192.21 |
| 4,682,143 | * 7/1987 | Chu et al. | 204/192.21 |
| 4,732,874 | * 3/1988 | Sparks | 437/247 |

FOREIGN PATENT DOCUMENTS

WO83/00256  1/1983  (WO) .

OTHER PUBLICATIONS

S.F. Gong et al., "Electrical and structural properties of thin films of sputtered crsi2," *Thin Solid Films*, vol. 208, No. 1 (Feb. 10, 1993), pp. 91–95.

G. Lamb et al., "Integrated Circuit Broadband Infrared Sources," *NTIS Tech Notes*, p. 724.

S. Wolf and R.N. Tauber; "Silicon Processing for the VLSI Era"; vol. 1 –Process Technology; pp. 56–58; 230–234.

Tomasz Filutowicz, Wojciech Gregorczyk & Boguslaw Stepien; "The Effect of Film Thickness on Certain Properties of Cr–SiO Cermet Thin Films" pp. 117–125.

M. Milosavljevic, T.M. Nenadovic, N. Bibic & T. Dimitrijevic; "Electrical Properties of 70wt. % Cr–30wt. % SiO Thin Films" pp. 167–178; Out of book entitled Thin Solid Films.

* cited by examiner

*Primary Examiner*—Rodney McDonald
(74) *Attorney, Agent, or Firm*—Skjerven Morrill MacPherson LLP; Edward C. Kwok

(57) ABSTRACT

A process for increasing the sheet resistance and lowering the temperature coefficient of resistance of a thin film resistor deposited on a wafer, the process comprising ramping the temperature of the wafer to an annealing temperature above the decomposition temperature of the thin film resistor using a radiant heat source such that the wafer reaches the annealing temperature within a ramp up time of from about 5 to 10 seconds, and annealing the wafer at the annealing temperature for an annealing period of from about 50 to 85 seconds.

7 Claims, 1 Drawing Sheet

SICR THIN FILM RESISTORS HAVING IMPROVED TEMPERATURE COEFFICIENTS OF RESISTANCE AND SHEET RESISTANCE

BACKGROUND OF THE INVENTION

1. Field of the Invention

The present invention relates to thin film resistors, and more particularly but not by way of limitation, to Silicon Chromium (SiCr) thin film resistors having improved temperature coefficients. In one aspect, the present invention relates to a process for producing SiCr thin film resistors having improved temperature coefficients of resistance and enhanced sheet resistance values.

2. Description of the Prior Art

SiCr thin film resistors and processes for fabricating such resistors have heretofore been known. Generally, SiCr thin film resistors have been fabricated by forming a thin film of SiCr on a substrate utilizing a DC or rf sputtering process. The SiCr film formed on a substrate using either a DC or rf sputtering process inherently possesses a high temperature coefficient of resistance and the maximum obtainable sheet resistance for such a film is limited.

Temperature coefficient of resistance (TCR) is a measure of the ability of a film's sheet resistance to change the least when the temperature of the film is increased and decreased. For resistors, the (TCR is determined by measuring resistance at different temperatures and thereafter computing the rate of resistance change per degree of temperature. This parameter, which is expressed in parts per million per degrees Celsius (ppm/° C.) and is generally a function of the film material, film composition and deposition conditions, is extremely difficult to control and can be negative (when the resistance decreases as the temperature increases) or positive (when the resistance increases as the temperature increases).

The sheet resistance of a SiCr film can be enhanced by annealing a deposited film in a nitrogen and oxygen environment. The sheet resistance of the SiCr alloy film can be increased approximately 280% by annealing at a temperature of 475 degrees Celsius for 30 minutes. After the first 30 minutes of annealing, further increases in the sheet resistance of the film are dependent on the temperature. However, increasing the temperature for a SiCr film over 480° C. in an effort to further increase the sheet resistance of the SiCr film is not desirable because the SiCr film decomposes at temperatures greater than 480 degrees Celsius and is thus destroyed.

It has also been proposed to enhance the sheet resistance of a thin film by thinning of the film, that is, to deposit a thinner film on the substrate. However, when one attempts to thin down the film the quality of the film degrades and the film becomes more sensitive to downstream processing steps.

SiCr resistors currently available generally possess a TCR which is too high. This renders such resistors unacceptable for many new circuit designs. New and improved processes for fabricating SiCr resistors can substantially lower TCRs, while at the same time enhancing the sheet resistance of the SiCr film. The present invention is directed to such a process.

SUMMARY OF THE INVENTION

According to the present invention, the (TCR) is lowered and the sheet resistance of a SiCr thin film resistor is enhanced by rapidly heating the SiCr thin film at a temperature of from about 550° C. to about 650° C. well above the temperature at which SiCr decomposes in a nitrogen atmosphere for a period of time effective to anneal the SiCr thin film. More specifically, the TCR and sheet resistance of a SiCr resistor can be enhanced when the resistor is fabricated in accordance with the process of the present invention which includes the steps of:

(a) sputtering a silicon/chrome alloy from a silicon/chrome target onto a phosphorus doped silicon dioxide wafer so as to provide a SiCr film;

(b) ramping the temperature of the wafer to a first annealing temperature which is above the decomposition temperature of the thin film resistor by using a radiant heat source such that the wafer reaches the first annealing temperature within a ramp up time of from about 5 to 10 seconds;

(c) annealing the wafer at the first annealing temperature for a first annealing period of from about 50 to 85 seconds;

(d) cooling the annealed wafer by heat dissipation;

(e) masking the wafer with a first resist mask so as to define a resistor bar region;

(f) etching the masked wafer so as to form a resistor bar in the resistor bar region;

(g) removing the first resist mask from the wafer;

(h) depositing a blanket of aluminum on the wafer and the resistor bar;

(i) masking the wafer with a second resist mask so that aluminum contact regions for the resistor bar are defined;

(j) etching the wafer so as to form aluminum contacts for the resistor bar in the aluminum contact regions;

(k) removing the second resist mask from the wafer;

(l) annealing the wafer at a second annealing temperature of about 475° C. to ensure good electrical contact between the aluminum contacts and the resistor bar;

(m) passivating the wafer;

(n) masking the wafer with a third resist mask so that window regions over the aluminum contacts are defined;

(o) etching the wafer so as to form windows to the aluminum contacts; and (p) removing the third resist mask.

An object of the present invention is to provide an improved SiCr resistor having an improved (TCR) and an enhanced sheet resistance.

Another object of the present invention, while achieving the before-stated object, is to provide an improved process for fabricating the SiCr resistor having an improved TCR and an enhanced sheet resistance.

Other objects, features and advantages of the present invention will become apparent from the following detailed description when read in conjunction with the drawings and appended claims.

DETAILED DESCRIPTION

Figure 1:
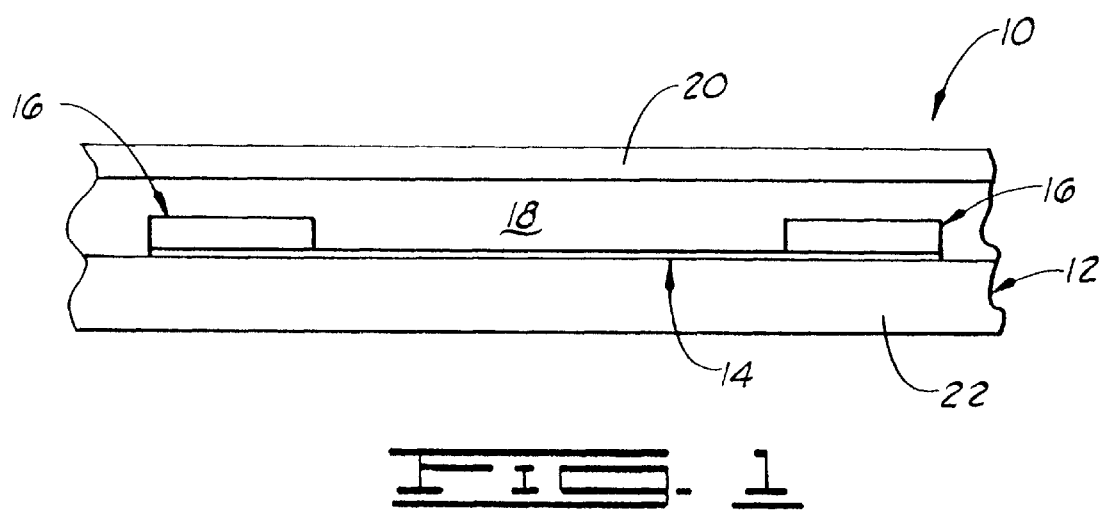
FIG. 1 is a cross-sectional representation of a portion of a SiCr resistor fabricated in accordance with the process of the present invention.

The present invention relates to a SiCr thin film resistor having an improved temperature coefficient of resistance (TCR) and enhanced sheet resistance; and to a process for fabricating a SiCr thin film resistor having an improved TCR and enhanced sheet resistance.

Referring now to FIG. 1, a portion of a SiCr thin film resistor 10 constructed in accordance with the present invention is pictorially illustrated. The SiCr thin film resistor 10, which is also sometimes referred to herein simply as a resistor, comprises a phosphorous doped low temperature silicon dioxide wafer 12, a SiCr thin film 14, aluminum contacts 16 for interconnecting the resistors, a phosphorous doped oxide layer 18 and a nitride layer 20. It should be noted that the components of the resistor 10 appear to be similar to the components of a conventional SiCr thin film resistor. However, as will be shown hereinafter, the SiCr thin-film resistor 10 fabricated by the process of the present invention differs from a conventional SiCr thin film resistor of the prior art in that the resistor 10 has improved characteristics as to TCR and sheet resistance.

In the fabrication of the resistor 10, a silicon substrate 22 is thermally oxidized to form a layer of silicon dioxide on an upper surface of the silicon substrate 22; a phosphorus doped low temperature silicon film is chemically formed on the silicon dioxide layer. A silicon/chrome alloy is then sputtered from a silicon chrome target onto the phosphorous doped low temperature silicon dioxide wafer 12 so as to provide the SiCr thin film 14 on an upper surface of the phosphorous doped low temperature silicon dioxide wafer 12.

The silicon/chromium target employed in the fabrication of the SiCr thin film resistor 10 has a purity of about 99.5%; and the target has a composition of about 72% silicon and about 28% chromium, based on atomic weight. The deposition of SiCr thin film 14 on the silicon substrate 22 is carried out using a conventional DC of rf sputtering system such as Balzers LLS801 system with DC power.

After the formation of the SiCr thin film 14 on the silicon substrate 22, the wafer 12 is rapidly heated from room temperature to an annealing temperature in a nitrogen atmosphere and maintained at the annealing temperature for a period of time effective to anneal the SiCr thin film. Any suitable heat source capable of rapidly heating the wafer 12 to the desired annealing temperature can be employed. However, desirable results have been obtained when halogen lamps are used as the heat source.

In order to enable one to more fully appreciate the inventive concept disclosed herein, it is believed desirable that certain terms employed in the description of the invention be defined. Thus, the following definitions are set forth.

"Rapidly heated" is the ramp up time from room temperature to the annealing temperature of the SiCr thin film and is a period of time of from about 5 to about 10 seconds.

"Annealing temperature" is the temperature at which the SiCr thin film is annealed. The annealing temperature for the SiCr thin film in accordance with the present invention is from about 550 to about 650° C., and more desirably about 650° C.

The period of time effective to anneal the SiCr thin film 14 using the rapid thermal anneal concept of the present invention is from about 50 to 85 seconds.

As will be set forth hereinafter, the rapid thermal annealing of the SiCr thin film 14 (which, including ramp up time, is from about 60 to 90 seconds) is important in the fabrication of the SiCr thin film resistors 10 of the present invention.

After the rapid thermal annealing of the SiCr thin film, the wafer 12 is allowed to cool by heat dissipation. A first resist mask is then applied to the annealed SiCr thin film of the wafer 12 so as to define resistor bar regions. It should be noted that a resistor constructed in accordance with the present invention will generally include rectangularly shaped bars in which the length to width ratio of the bars is dependent upon the desired resistance of the resistor. Thus, the resistor bar regions defined by the first resist mask will conform to the shape and size of the resistor bars to be formed on the wafer 12.

The wafer 12 is then etched to define the resistor bars. Any etching procedure can be employed to define the resistor bars, such as a conventional dry etching procedure. After the wafer 12 has been etched so as to define the resistor bars, the first resist mask is removed by any well known conventional procedure, such as by exposure to an oxygen plasma.

After the resistor bars have been formed, a blanket of aluminum is deposited on the wafer 12 so as to cover or blanket the SiCr thin film 14 and the resistor bars. A second resist mask is then applied to selected regions of the aluminum blanketed wafer so that the end portions of the resistor bars are masked and leads to an area in the field are defined. The masking of the wafer 12 with the second resist mask defines leads to an area in the field so that electrical testing of the resistor can be carried out when the fabrication process of the resistor is completed.

The aluminum blanketed wafer 12 is then etched so as to remove unmasked aluminum and thereby expose the oxide field and the body portions of the resistor bars. Any conventional wet etching procedure well known in the fabrication of wafers can be employed to remove the unmasked aluminum. However, desirable results have been obtained when a conventional aluminum wet etching process employing nitric acid and phosphoric acid is used. After wet etching of the aluminum blanketed substrate is completed, the second resist mask is removed with an oxygen plasma so as to provide leads to the area in the field and aluminum contacts on the ends of the resistor bars.

After removal of the second resist mask from the wafer 12, the wafer 12 is heated to a temperature of about 475° C. in a hydrogen/nitrogen atmosphere for a period of time effective to alloy the SiCr and the aluminum contacts and provide a resistor. The time required to alloy the SiCr and aluminum contacts can vary, but generally such alloying is accomplished in about 30 minutes.

Once the alloying of the SiCr and aluminum contacts has been carried out, the wafer is passivated to protect the resistor formed thereon. Any suitable passivation technique can be employed to passivate the wafer, such as application of a phosphorous doped oxide, i.e., a vapor over metal (VOM) passivation, or a phosphorous doped oxide covered with a nitride layer.

The passivated wafer 12 is then masked with a third resist mask to provide windows defining metal lines; and the masked alloyed wafer is etched to open the metal lines so that electrical contacts can be made to the resistors. The third resist mask is then removed using an oxygen plasma and the SiCr resistor prepared in accordance with the present invention was recovered and tested to determine its TCR and sheet resistance.

In order to further illustrate the present invention the following example is set forth. However, it is to be understood that the example is for illustrative purposes only and is not to be construed as limiting the scope of the present invention.

EXAMPLE

A series of experiments were conducted to compare the characteristics of resistors formed employing conventional SiCr thin films annealing techniques (hereinafter referred to as control resistors) with resistors formed employing rapid thermal annealing techniques of the present invention. The process employed in the formation of the control resistors and the resistors of the present invention were substantially the same except that in the preparation of the resistors of the present invention the SiCr thin films were annealed using a rapid thermal anneal procedure and the SiCr thin films of the control resistors were annealed using standard anneal procedures performed by horizontal furnaces.

In the preparation of resistors using the rapid thermal annealing techniques in accordance with the present invention, a 1000 ohms/sq. SiCr thin film was deposited on the wafer and then the rapid thermal annealing of the SiCr thin film was carried out using halogen lamps and a nitrogen environment. The SiCr thin films were subjected to rapid thermal annealig of 60 seconds, including ramp up time.

The rapid thermal annealing temperature was varied to determine what effect, if any, the temperature had on the TCR and the sheet resistance. The rapid thermal annealing temperatures studied were 550° C., 600° C., and 650° C.

The effect of passivation of the wafers was also studied to determine what effect, if any, variations in the passivation procedures would have on the TCR and the sheet resistance.

The results of the Experiments are set forth as follows:
(1) The control resistors exhibited a TCR of 43 to –210 ppm/° C. over a temperature range of –60° C. to 130° C. and a sheet resistance of 980 ohms/sq.
(2) The control resistors prepared by employing the passivation technique using phosphorous doped oxide (VOM) exhibited a TCR of 9 to –231 and a sheet resistance of 1000 ohms/sq.
(3) The resistors prepared in accordance with the process of the present invention wherein the rapid thermal annealing temperature was 550° C. and the passivation technique employed was phosphorous doped oxide (VOM) exhibited a TCR of –5 to –191 ppm/° C. over a temperature range of –60° C. to 130° C. and a sheet resistance of 990 ohms/sq.
(4) The resistors prepared in accordance with the process of the present invention wherein the rapid thermal annealing temperature was 550° C. and the passivation technique employed was phosphorous doped oxide (VOM) covered with a nitride layer exhibited a TCR of –41 to –250 ppm/° C. over a temperature range of –60° C. to 130° C. and a sheet resistance of 1060 ohms/sq.
(5) The resistors prepared in accordance with the process of the present invention wherein the rapid thermal annealing temperature was 600° C. and the passivation technique employed was phosphorous doped oxide (VOM) exhibited a TCR of 19 to –140° C. over a temperature range of –60° C. to 130° C. and a sheet resistance of 1090 ohms/sq.
(6) The resistors prepared in accordance with the process of the present invention wherein the rapid thermal annealing temperature was 600° C. and the passivation technique employed was phosphorous doped oxide covered with a nitride layer exhibited a TCR of 23 to –137 ppm/° C. over a temperature range of –60° C. to 130° C. and a sheet resistance of 1090 ohms/sq.
(7) The resistors prepared in accordance with the process of the present invention wherein the rapid thermal annealing temperature was 650° C. and the passivation technique employed was phosphorous doped oxide (VOM) exhibited a TCR of 82 to –48 ppm/° C. over a temperature range of –60° C. to 130° C. and a sheet resistance of 1410 ohms/sq.
(8) The resistors prepared in accordance with the process of the present invention wherein the rapid thermal annealing temperature was 650° C. and the passivation technique employed was phosphorous doped oxide covered with a nitride layer exhibited a TCR of 54 to –43° C. over a temperature range of –60° C. to 130° C. and a sheet resistance of 1450 ohms/sq.

The above data clearly indicate that resistors prepared in accordance with the process of the present invention exhibit improved TCRs and sheet resistance when compared with resistors prepared using conventional annealing techniques. That is, the data obtained from the experiments set forth above clearly indicate: (a) the TCRs for the control resistors start in the positive regime and move into the negative regime as the temperature is increased; (b) the TCRs for the resistors prepared in accordance with the process of the present invention at a rapid thermal annealing temperature of 550° C. start in the negative regime and remain in the negative regime as the temperature is increased; (c) the TCRs for the resistors prepared in accordance with the process of the present invention at a rapid thermal annealing temperature of 600° C. start in the positive regime and go to –130 as the temperature is increased; (d) the temperature coefficients of resistance for the resistors prepared in accordance with the process of the present invention at a rapid thermal annealing temperature of 650° C. start in the positive regime and go to below –50 as the temperature is increased; (e) with the exception of the resistors prepared in accordance with the process of the present invention at a rapid thermal annealing temperature of 600° C., the wafers passivated with phosphorous doped oxide covered with a nitride layer exhibit lower starting TCRs, and rapid thermal annealing of the SiCr thin films improves the TCRs for wafers passivated with either phosphorous doped oxide or a phosphorous doped oxide covered with a nitride layer; (f) the most desirable results as to TCRs are obtained wherein the resistors are prepared using a rapid thermal annealing temperature of 650° C.; (g) the average TCRs prepared in accordance with the process of the present invention at a rapid thermal annealing temperature of 600° C. are negative in the range from –30° C. to 130° C. while having lower absolute values than the prior art. Note that this implies the resistance value may be monotonically increasing or montonically increasing; (h) the average TCRs prepared in accordance with the process of the present invention at a rapid thermal annealing temperature of 650° C. are in the range from 28 ppm/° C. to –31 ppm/° C. from –30° C. to 90° C.; (i) the average TCRs prepared in accordance with the process of the present invention at a rapid thermal annealing temperature of 650° C. measured from 25° C. to 60° C. is –1.0 ppm/° C., although with a standard deviation of 5.7 ppm/° C.; and (j) the greatest enhanced sheet resistance and the greatest enhanced TCRs both occur at the same rapid thermal annealing temperature of 650° C. Among other things, this implies that larger resistors than currently possible with the present art may be made with lower TCRs than are possible with the present art.

It is clear that the present invention is well adapted to carry out the objects and attain the ends and advantages mentioned herein. While presently preferred embodiments of the invention have been described for purposes of this disclosure, numerous changes may be made which will readily suggest themselves to those skilled in the art and which are encompassed within the spirit of the invention disclosed and as defined in the appended claims.

What is claimed is:

1. A process for increasing the sheet resistance and lowering the temperature coefficient of resistance of a thin film resistor deposited on a wafer, the process comprising:

(a) ramping the temperature of the wafer to an annealing temperature which is above the decomposition temperature of the thin film resistor by using a radiant heat source such that the wafer reaches the annealing temperature within a ramp up time of from about 5 to 10 seconds;

(b) annealing the wafer at the annealing temperature for an annealing period of from about 50 to 85 seconds; and (c) cooling the annealed wafer by radiant cooling.

2. The process of claim 1, wherein the thin film resistor is a thin film of SiCr deposited on the wafer by sputtering a silicon/chrome alloy from a silicon chrome target onto the wafer, the annealing temperature is between about 550° C. and 650° C., the step of annealing the wafer is carried out in a nitrogen atmosphere and the wafer is a phosphorus doped silicon dioxide wafer.

3. The process of claim 2 wherein the annealing temperature is about 650° C. and the total of the annealing period and ramp up time is about 60 seconds.

4. A process for enhancing the sheet resistance and lowering the temperature coefficient of resistance of SiCr thin film resistors, the process comprising the steps of:

(a) sputtering a silicon/chrome alloy from a silicon/chrome target onto a phosphorus doped silicon dioxide wafer so as to provide a SiCr film;

(b) ramping the temperature of the wafer to a first annealing temperature which is above the decomposition temperature of the thin film resistor by using a radiant heat source such that the wafer reaches the first annealing temperature within a ramp up time of from about 5 to 10 seconds;

(c) annealing the wafer at the first annealing temperature for a first annealing period of from about 50 to 85 seconds;

(d) cooling the annealed wafer by heat radiant cooling;

(e) masking the wafer with a first resist mask so as to define a resistor bar region;

(f) etching the masked wafer so as to form a resistor bar in the resistor bar region;

(g) removing the first resist mask from the wafer;

(h) depositing a blanket of aluminum on the wafer and the resistor bar;

(i) masking the wafer with a second resist mask so that aluminum contact regions for the resistor bar are defined;

(j) etching the wafer so as to form aluminum contacts for the resistor bar in the aluminum contact regions;

(k) removing the second resist mask from the wafer;

(l) annealing the wafer at a second annealing temperature of about 475° C. for a second annealing period to ensure good electrical contact between the aluminum contacts and the resistor bar;

(m) passivating the wafer;

(n) masking the wafer with a third resist mask so that window regions over the aluminum contacts are defined;

(o) etching the wafer so as to form windows to the aluminum contacts; and (p) removing the third resist mask.

5. The process of claim 4 wherein the first annealing temperature is between about 550° C. and 650° C., the anneal performed during the first annealing period is carried out in a nitrogen atmosphere, the anneal performed during the second annealing period is performed in a hydrogen/nitrogen atmosphere, and the second annealing period is 30 minutes.

6. The process of claim 5 wherein the silicon/chromium target has a purity of about 99.5%, and the target has a composition of about 72% silicon and about 28% chromium, based on atomic weight.

7. The process of claim 5 wherein the first annealing temperature is about 650° C. and the total of the first annealing period and ramp up time is about 60 seconds.

* * * * *